(12) United States Patent
Kim (10) Patent No.: US 9,741,700 B2
(45) Date of Patent: Aug. 22, 2017

(54) LIGHTING DEVICE

(71) Applicant: HYUNDAI MOBIS CO., LTD., Seoul (KR)

(72) Inventor: Ji Seong Kim, Seoul (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 14/997,359

(22) Filed: Jan. 15, 2016

(65) Prior Publication Data

US 2016/0284674 A1    Sep. 29, 2016

(30) Foreign Application Priority Data

Mar. 23, 2015  (KR) .......................... 10-2015-0039870

(51) Int. Cl.
| | |
|---|---|
| H01L 29/18 | (2006.01) |
| H01L 25/075 | (2006.01) |
| F21V 7/00 | (2006.01) |
| H01L 33/60 | (2010.01) |
| F21Y 105/00 | (2016.01) |
| F21Y 115/10 | (2016.01) |

(Continued)

(52) U.S. Cl.
CPC ........ *H01L 25/0753* (2013.01); *F21V 7/0008* (2013.01); *F21S 48/211* (2013.01); *F21S 48/215* (2013.01); *F21S 48/234* (2013.01); *F21S 48/238* (2013.01); *F21S 48/24* (2013.01); *F21W 2101/02* (2013.01); *F21Y 2105/00* (2013.01); *F21Y 2115/10* (2016.08); *H01L 33/60* (2013.01)

(58) Field of Classification Search
CPC ... H01L 25/0753; H01L 33/42; F21V 7/0008; F21Y 2115/10; F21S 48/211; F21S 48/215; F21S 48/234; F21S 48/238; F21S 48/24

USPC ........................................................... 257/88
See application file for complete search history.

(56) References Cited

U.S. PATENT DOCUMENTS 6,326,644 B1 * 12/2001 Lee .................... G06K 9/00013
                                                    257/103
2012/0320308 A1 * 12/2012 Yeo ................... G02F 1/133555
                                                    349/62

FOREIGN PATENT DOCUMENTS

| JP | 62-78755 A | 4/1987 |
|---|---|---|
| JP | 64-78044 A | 3/1989 |
| JP | 2003-1737 A | 1/2003 |

(Continued)

OTHER PUBLICATIONS

NPL Machine Translation JP 2011-014428.*

(Continued)

*Primary Examiner* — Allen Parker
*Assistant Examiner* — Patricia Reddington
(74) *Attorney, Agent, or Firm* — Knobbe Martens Olson & Bear LLP (57) ABSTRACT

The present disclosure provides a lighting device comprising: a reflective element layer; an optical resin layer formed on the reflective element layer; a transparent electrode film layer formed on the optical resin layer; and a plurality of light-emitting units formed on the lower surface of the transparent electrode film layer. The lighting device allows the fundamental cause of the hot spot phenomenon to be eliminated, shows excellent luminous efficiency by efficiently performing the function of a surface light source, and enables the kinds of raw materials and the number of production processes to be reduced by eliminating the use of a PCB board and selectively applying second reflective patterns.

15 Claims, 2 Drawing Sheets

(51) Int. Cl.
    *F21S 8/10*        (2006.01)
    *F21W 101/02*      (2006.01)

(56) References Cited

FOREIGN PATENT DOCUMENTS

| | | |
|---|---|---|
| JP | 2003-242804 A | 8/2003 |
| JP | 2006-321903 A | 11/2006 |
| JP | 2010-230714 A | 10/2010 |
| JP | 2012-89698 A | 5/2012 |
| JP | 2012-204136 A | 10/2012 |
| JP | 2014-35980 A | 2/2014 |
| JP | 2014-516198 A | 7/2014 |
| JP | 2015-43307 A | 3/2015 |
| KR | 10-2012-0009209 A | 2/2012 |
| NO | 2014/038279 A1 | 3/2014 |
| NO | 2015/016642 A1 | 2/2015 |

OTHER PUBLICATIONS

NPL Machine Translation KR 10-2012-0009209.*
Office Action dated Oct. 25, 2016 of corresponding Japanese Patent Application No. 2016-002037—7 pages.

* cited by examiner

LIGHTING DEVICE

CROSS-REFERENCE TO RELATED APPLICATION

This application claims the benefit of Korean Patent Application No. 10-2015-0039870, filed Mar. 23, 2015 in the Korean Intellectual Property Office, the entire disclosures of which are incorporated herein by reference.

FIELD

The present disclosure relates to a lighting device.

DISCUSSION OF THE RELATED TECHNOLOGY

With the recent development of technology, lighting devices employing a variety of light sources have adopted a suitable light source depending on their electrical properties in order to increase luminous efficiency.

Such lighting devices have been used in various applications, including backlight units for flat panel displays, indoor lamps, as well as headlamps, fog lamps, reversing lamps, position lamps, number plate lamps, tail lamps, stop lamps, turn signal lamps, emergency warning lamps, and indoor lighting lamps, which are provided in cars.

Meanwhile, a light-emitting diode (LED) is an element that converts electrical signals into infrared rays or light using the characteristics of a compound semiconductor, and has advantages over florescent lamps in that it causes less environmental pollution because it does not use toxic substances such as mercury, has a long lifespan, requires low power consumption, and has excellent visibility and low glare.

In recent years, lighting devices have developed from a configuration that uses traditional light sources such as conventional incandescent bulbs or fluorescent lamps as a light source into a configuration that uses the above-described LED as a light source. An example of the latter configuration including a lighting device disclosed in Korean Laid-Open Patent Publication No. 10-2012-0009209. Further, KR 10-2012-0085181, JP2011-14428, and the like discloses the related technology.

SUMMARY

The present disclosure relates to a lighting device comprising a plurality of light-emitting units (LED light source) provided in a direction opposite to a surface light source (reflective element layer) by a chip-on-film (COF) method. Thus, the lighting device according to embodiments of the present invention has advantages in that it can eliminate the fundamental cause of the hot spot phenomenon, shows excellent luminous efficiency by efficiently performing the function of a surface light source, and enables the kinds of raw materials and the number of production processes to be reduced by eliminating the use of a PCB board and selectively applying second reflective patterns.

In one aspect, the present disclosure is directed to a lighting device. The lighting device comprises: a reflective element layer; an optical resin layer formed on the reflective element layer; a transparent electrode film layer formed on the optical resin layer; and a plurality of light-emitting units formed on the lower surface of the transparent electrode film layer.

The reflective element layer may comprise a resin matrix and a white pigment dispersed in the resin matrix.

The matrix resins may include polyethylene terephthalate resins, polyethylene naphthalate resins, acrylic resins, polycarbonate resins, polystyrene resins, polyolefin resins, cellulose acetate resins and the like.

The white pigment may include titanium oxide, aluminum oxide, zinc oxide, lead carbonate, barium sulfate, silica, calcium carbonate and the like.

The lighting device may further comprise first reflective patterns formed on the upper surface of the reflective element layer.

The first reflective patterns may be formed by printing a reflective ink containing a white pigment in a binder.

The optical resin layer may include urethane acrylate resins, epoxy acrylate resins, polyester acrylate resins and the like.

The optical resin layer may include beads made of silicon, glass bubbles, zinc, zirconium, aluminum oxide, urethane resins, (meth)acrylic resins and the like.

The beads may have voids or pores formed therein.

The transparent electrode film layer may comprise an insulating transparent resin layer and a conductive transparent electrode layer formed on the upper surface of the insulating transparent resin layer.

The insulating transparent resin layer may include polycarbonate resins, polyester resins, polyimide resins, cycloolefin resins, copolymers thereof and the like.

The conductive transparent electrode layer may comprise about 60-95 wt % of polymer resins, about 4-35 wt % of an electrically conductive material, and about 1-10 wt % of polydopamine resins.

The conductive transparent electrode layer may further include palladium, platinum, aluminum, silver, copper, gold, nickel, tin, indium oxide, cobalt, indium tin oxide (ITO), antimony tin oxide (ATO), fluorine-doped tin oxide (FTO), zinc tin oxide (ZTO), metal nanowires, carbon nanotubes (CNTs), graphene and the like.

The transparent electrode film layer may have a surface resistivity of about 0.01-100 Ω/square as measured in accordance with ASTM D257, and a transparency of about 80% or more as measured in accordance with ASTM D1003, and an average thickness of about 10-200 μm.

The lighting device may further comprise second reflective patterns for shielding or reflecting light, formed on the upper surface of the transparent electrode film layer.

The light-emitting units may comprise a light-emitting diode (LED).

DETAILED DESCRIPTION OF EMBODIMENTS

Hereinafter, embodiments of the present invention will be described in detail with reference to the accompanying drawings so that those skilled in the technical field to which the present invention pertains can easily carry out the present invention. However, it should be understood that the embodiments disclosed in the specification and the configurations shown in the drawings are embodiments of the present invention, and there may be various equivalents and modifications that can replace these embodiments and configurations at the time of filing this application.

The terms used in the following description are terms defined by taking into consideration the functions obtained in accordance with embodiments of the present invention, and the meaning of each term should be interpreted based on the entire content of the specification. Throughout the drawings, the same reference numerals are used for elements are used to designate elements having similar functions and operations.

Figure 1:
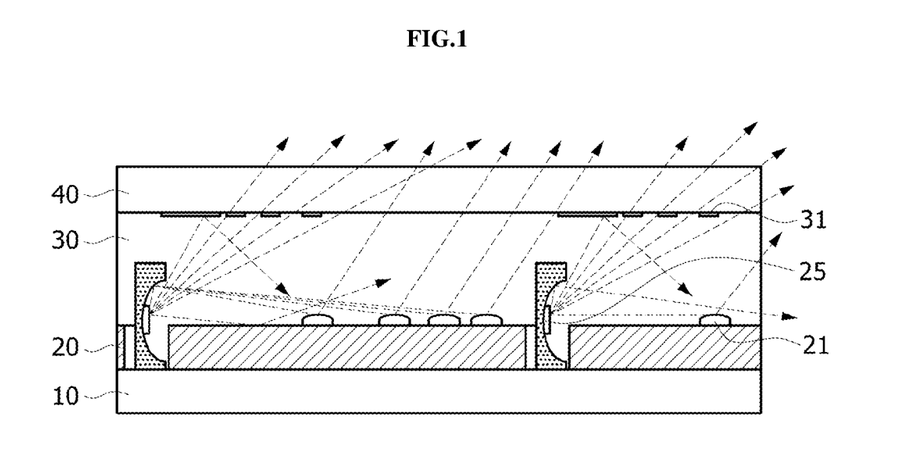
FIG. 1 is a cross-sectional view schematically showing the structure of a lighting device.

One example of a lighting device is shown in FIG. 1 which is a cross-sectional view schematically showing the lighting device. Referring to FIG. 1, the lighting device may be formed by a method comprising: bonding a reflective film 20 to the surface of a printed circuit board (PCB) 10; mounting an LED 25 in the reflective film 20 in a lateral direction to form a surface light source; overmolding an optical resin on the surface of the resulting structure to form a resin layer 30; and applying an optical film 40 to the surface of the resin layer 30.

Herein, light incident from the LED 25 to the reflective film 20 may be emitted upward by fine reflective patterns or portions 21 provided on the reflective film 20 or may be shielded or diffused by optical patterns or portions 31 formed under the optical film 40, thereby preventing the light from being concentrated.

However, in this LED lighting device, because light is emitted in a lateral direction from the LED mounted on the PCB, the luminous efficiency of the reflective film is reduced. Further, a process for forming light-shielding patterns that prevent a hot spot phenomenon from occurring during light emission may increase the number of processes, resulting in an increase in the production cost.

Thus, one aspect provides a lighting device which avoids or minimizes hot spot phenomenon and allows the production cost to be reduced by reducing the use of raw and subsidiary materials.

The present disclosure relates to a lighting device. In the lighting device shown in FIG. 1, LEDs as light sources are mounted laterally on a PCB board so as to emit light laterally to a reflective element. As a substitute for such LEDs, a plurality of light-emitting units in the lighting device according to embodiments of the present invention are formed in a direction opposite to a surface light source (reflective element layer) so as to be spaced apart from each other. Thus, the lighting device according to embodiments of the present invention can fundamentally prevent the hot spot phenomenon, shows excellent luminous efficiency by efficiently performing the function of the surface light source, and enables the kinds of raw materials and the number of production processes to be reduced.

In addition, a lighting device according to an embodiment of the present invention may be applied to various lamp devices for lighting, for example, car lamps, household lighting devices, and industrial lighting devices. For example, it may be applied to car lamps, including headlights, car indoor lights, door scarfs, rear lights, etc. Additionally, the lighting device of embodiments of the present invention may also be applied to backlight units for liquid crystal displays, as well as any lighting devices that have been already developed and commercialized or can be embodied with the development of technology in the future.

Lighting Device

In one aspect, the present disclosure is directed to a lighting device. The lighting device comprises: a reflective element layer; an optical resin layer formed on the reflective element layer; a transparent electrode film layer formed on the optical resin layer; and a plurality of light-emitting units formed on the lower surface of the transparent electrode film layer.

Figure 2:
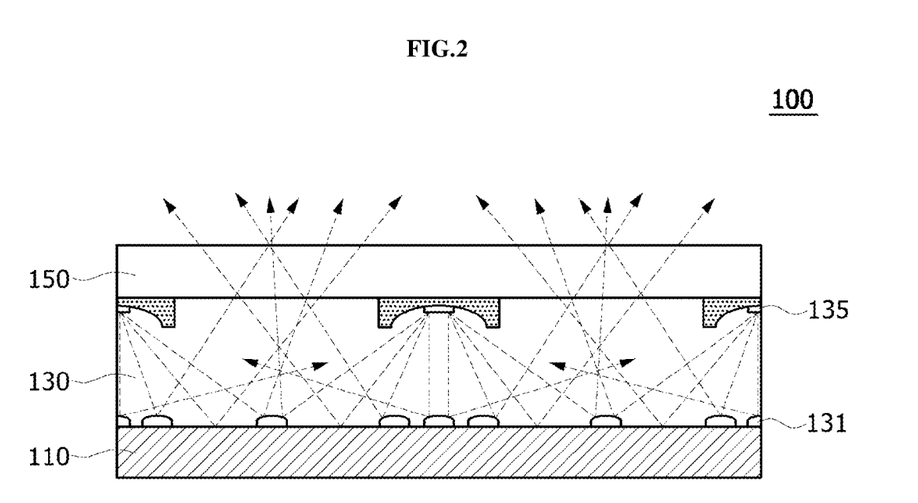
FIG. 2 is a cross-sectional view schematically showing a lighting device according to an embodiment of the present invention.

FIG. 2 is a cross-sectional view schematically showing a lighting device according to an embodiment of the present invention.

Referring to FIG. 2, a lighting device 100 according to an embodiment of the present invention comprises: a reflective element layer 110; an optical resin layer 130 formed on the reflective element layer 110; and a transparent electrode film layer 150 formed on the optical resin layer 130; and a plurality of light-emitting units 135 formed on the lower surface of the transparent electrode film layer 150 so as to be spaced apart from each other. The lighting device 100 may further comprise first reflective patterns or pieces 131 formed on the upper surface of the reflective element layer 110. Thus, according to this lighting device 100, the hot spot phenomenon can be prevented from occurring by emitting light laterally from LED light sources mounted on a PCB board to a reflective element in the lighting device shown in FIG. 1, and the efficiency of the surface light source can be increased.

Figure 3:
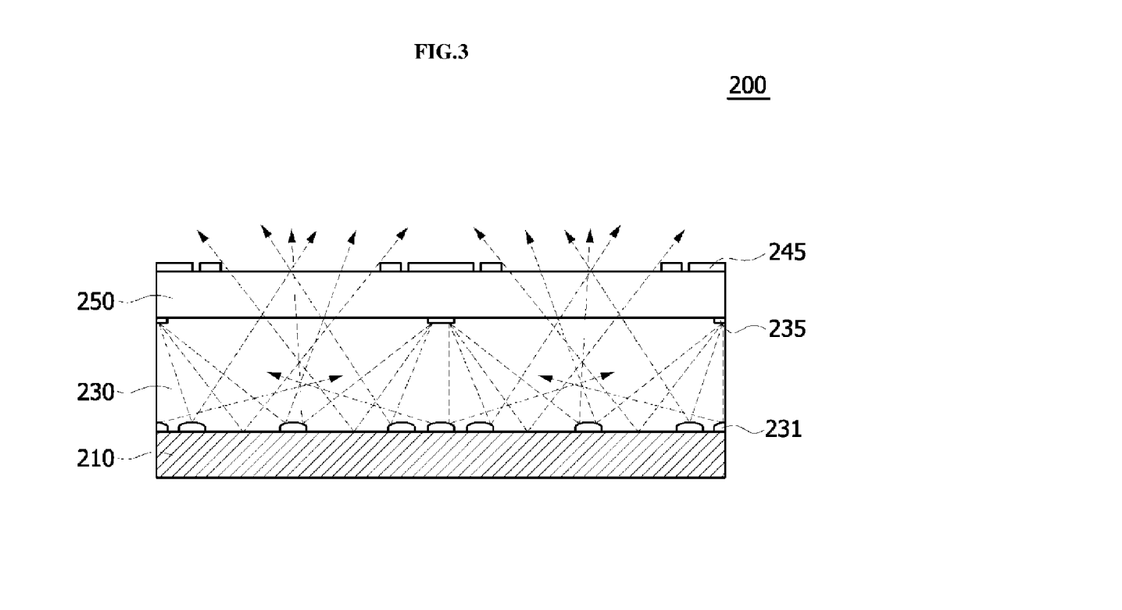
FIG. 3 is a cross-sectional view schematically showing a lighting device according to another embodiment of the present invention.

FIG. 3 is a cross-sectional view schematically showing a lighting device according to another embodiment of the present invention.

Referring to FIG. 3, a lighting device 200 according to another embodiment of the present invention comprises: a reflective element layer 210; an optical resin layer 230 formed on the reflective element layer 210; a transparent electrode film layer 250 formed on the optical resin layer 230; and a plurality of light-emitting units 235 formed on the lower surface of the transparent electrode film layer 250 so as to be spaced apart from each other. The lighting device 200 may further comprise first reflective patterns formed on the upper surface of the reflective element layer 210. Particularly, it may further comprise second reflective patterns or pieces 245 for shielding or reflecting light, formed on the upper surface of the transparent electrode film layer 250. Thus, according to this lighting device 200, the hot spot phenomenon can be prevented from occurring by emitting light laterally from LED light sources mounted on a PCB board to a reflective element in the lighting device shown in FIG. 1, and the efficiency of the surface light source can be increased. Particularly, the kinds of raw materials and the number of production processes can be reduced, because the second reflective patterns can be selectively applied.

Figure 4:
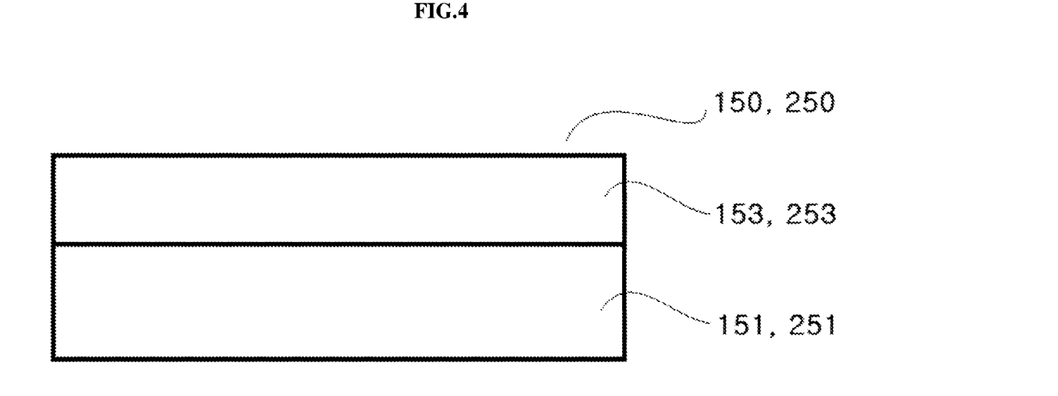
FIG. 4 is a cross-sectional view schematically showing the cross-section of the transparent electrode film layer of a lighting device according to embodiments of the present invention.

FIG. 4 is a cross-sectional view schematically showing the cross-section of the transparent electrode film layer of the lighting device according to embodiments of the present invention.

Referring to FIG. 4, the lighting device 100 or 200 of embodiments of the present invention comprises a transparent electrode film layer 150 or 250, in which the transparent electrode film layer 150 or 250 may be formed by providing an insulating transparent resin layer 151 or 251 and depositing a conductive transparent electrode layer 153 or 253 on the upper surface of the insulating transparent resin layer 151 or 251. Thus, according to embodiments of the present invention, the use of a PCB board shown in FIG. 1 can be eliminated, and the second reflective patterns (light shielding patterns) can be selectively applied.

Hereinafter, constituent elements forming the lighting device of embodiments of the present invention will be described in detail.

Reflective Element Layer

The reflective element layer 110 or 210 is formed of a material having high reflection efficiency, and is configured to upwardly reflect light emitted from the light-emitting units 135 or 235 of the lighting device 100 or 200 to thereby reduce the loss of the light.

The lighting device shown in FIG. 1 has a structure in which the reflective film 20 is formed on the upper surface of the printed circuit board (PCB) 10 and the light-emitting unit 25 is mounted on the PCB so as to pass through the reflective film 20, whereas in the embodiment of the present invention, this PCB is not used, and a surface light source is formed only of the reflective element layer and the below-described optical resin layer and transparent electrode film layer. Thus, the lighting device according to the embodiment of the present invention effectively substitutes for the lighting device shown in FIG. 1.

The reflective element layer 110 or 210 may comprise a resin matrix and a white pigment dispersed in the resin matrix. More specifically, the reflective element layer 110 or 210 may be in the form of a film, and may comprise a synthetic resin containing a white pigment dispersed therein so as to have the property of promoting the reflection and dispersion of light.

The resin matrix may include, for example, polyethylene terephthalate resins, polyethylene naphthalate resins, acrylic resins, polycarbonate resins, polystyrene resins, polyolefin resins, cellulose acetate resins and the like, but is not limited thereto.

The white pigment may include, for example, titanium oxide, aluminum oxide, zinc oxide, lead carbonate, barium sulfate, silica, calcium carbonate and the like. The lighting device 100 or 200 may further comprise first reflective patterns or pieces 131 or 231 formed on the upper surface of the reflective element layer 110 or 210. The white pigment may have a mean particle size of 5-15 μm, for example, 6-10 μm, for example, 7-9 μm. If the mean particle size is smaller than 5 μm, the visibility of the lighting device can be reduced, On the other hand, if the mean particle size is greater than 15 μm, clogging can occur when the white pigment is applied, or the uniformity of the surface of the layer formed by applying the white pigment can be reduced, resulting in decreases in storage stability and workability.

The first reflective patterns or pieces 131 or 231 may be configured to reflect (scatter or disperse) incident light to thereby enable the light to be uniformly transmitted upward. The first reflective patterns may be formed by printing a reflective ink containing a white pigment in a binder. For example, the first reflective pattern may be formed by printing the surface of the reflective element layer 110 or 210 with a reflective ink containing at least one of titanium oxide, aluminum oxide, zinc oxide, lead carbonate, barium sulfate, silica, calcium carbonate and the like, but is not limited thereto.

The first reflective pattern 131 or 231 may be configured to have a plurality of protruding patterns or pieces, and may have a dot pattern shape, a prism shape, a lenticular shape, a lens shape, or a combination of two or more thereof. However, the kind of shape is not limited thereto. In addition, the cross-sectional shape of the first reflective pattern 131 may be selected from among various shapes, including a triangular shape, a square shape, a semicircular shape and a sine-wave form.

Optical Resin Layer

The optical resin layer 130 or 230 is formed on the upper surface of the reflective element layer 110 or 210, and is configured to cause light emitted from the light-emitting unit 135 or 235 to diffuse forward.

The optical resin layer 130 or 230 is configured to enclose a plurality of light-emitting units 135 or 235 formed on the lower surface of the transparent electrode layer 150 and 250 in a direction opposite to the reflective element layer 110 or 210 by a chip-on-film (COF) method, and can function to disperse light emitted from the light-emitting unit 135 or 235.

The optical resin layer 130 or 230 may comprise a resin material capable of diffusing light. For example, the optical resin layer 130 or 230 may be made of a UV curing resin containing an oligomer. For example, the optical resin layer may include urethane acrylate resins, epoxy acrylate resins, polyester acrylate resins and the like. For example, it may be formed of a resin based on a urethane acrylate oligomer. Alternatively, the optical resin layer may comprise a resin obtained by mixing a synthetic urethane acrylate oligomer and a polyacrylic polymer. In this case, the optical resin layer may further comprise a low-boiling-point dilution-type reactive monomer including IBOA (isobornyl acrylate), HPA (hydroxylpropyl acrylate), 2-HEA (2-hydroxyethyl acrylate) and the like. In addition, the optical resin layer may comprise, as an additive, a photoinitiator such as 1-hydroxy-cyclohexyl phenyl-ketone or an antioxidant. However, the kind of resin or additive is not specifically limited.

The optical resin layer 130 or 230 has advantages in that it has a significantly reduced thickness compared to a light guide plate used in the lighting device shown in FIG. 1, and thus can reduce the total thickness of the lighting device, and in that it is flexible, and thus can be easily applied to a flexible curved surface and can increase the freedom of design.

The optical resin layer 130 or 230 may further include fluorophores or quantum dots therein. In an embodiment of the present invention, the fluorophores or quantum dots may be included for the purpose of changing the wavelength of light emitted from the plurality of light-emitting units.

The optical resin layer 130 or 230 may further include a plurality of beads therein. In an embodiment of the present invention, the beads may have voids or pores formed therein.

The beads may be included for the purpose of diffusing light in the optical resin layer 130 or 230. In embodiments, when light emitted from the light-emitting units 135 or 235 is incident into the beads in the optical resin layer 130 or 230, the light can be diffused through the voids of the beads, and the light diffused downward can be reflected by the reflective element layer 110 or 210 and emitted upward. In this case, the reflectivity and diffusivity of the light can be increased by the beads, and thus the quantity and uniformity of the emitted light being transmitted upward can be increased, resulting in an increase in the brightness of the lighting device 100 or 200.

The content of the beads can be suitably controlled. For example, the beads may be contained in an amount of about 0.01-1 wt % based on the total weight of the optical resin layer 130 or 230. In this bead content range, the quantity and uniformity of the emitted light can further be increased.

The beads may include silicon, glass bubbles, zinc (Zn), zirconium (Zr), aluminum oxide ($Al_2O_3$), urethane resins, (meth)acrylic resins and the like. For example, the (meth)acrylic resin may comprise polymethylmethacrylate (PMMA) resin, but is not limited thereto.

The beads may be formed to have a mean particle size ranging from about 1 μm to about 30 μm, for example, from about 10 μm to about 20 μm. In this mean particle size range, there is an advantage in that the reflectivity and diffusivity of light are increased, indicating that the optical resin layer has an excellent light-harvesting effect.

Transparent Electrode Film Layer

The transparent electrode film layer 150 or 250 is configured to form a surface light source in combination with the above-described reflective element layer 110 or 210 and optical resin layer 130 or 230 to thereby exclude the use of the PCB 10 of the light device shown in FIG. 1 and reduce the kinds of raw materials and the number of processes.

In an embodiment, the transparent electrode film layer may comprise an insulating transparent resin layer 151 or 251 and a conductive transparent electrode layer 153 or 253 formed on the upper surface of the insulating transparent resin layer 151 or 251.

The insulating transparent resin layer 151 or 251 may include one or a mixture (stack) of at least one of polycarbonate resins, polyester resins, polyimide resins, cycloolefin resins, copolymers thereof and the like. Examples of the polyester resin include polyethylene terephthalate (PET) resin and polybutylene terephthalate (PBT) resin. Examples of the cycloolefin resin include polynorbornene resin, etc. The insulating transparent resin layer can act as the insulating layer of the transparent electrode film layer, thereby increasing the visibility of the lighting device and ensuring the structural reliability of the lighting device.

The conductive transparent electrode layer 153 or 253 may be formed by electrospinning a transparent electrode film composition comprising a polymer resin, an electrically conductive material and a polydopamine resin.

The polymer resin may include polyethylene oxide (PEO), fluorinated polymers, sulfonated polysulfone, sulfonated polyimide, sulfonated polyethersulfone, sulfonated polyetheretherketone, polybenzimidazole-phosphate salt, polyvinylidene fluoride, polyacrylonitrile and the like. For example, it may include polyethylene oxide, polyimide and the like. However, the kind of polymer resin is not specifically limited. The polymer resin may be contained in an amount of about 60-95 wt %, for example, about 70-90 wt %, for example, about 75-85 wt %, based on 100 wt % of the total weight of the transparent electrode film composition. In this content range, nanoweb formation and electrospinning can be easily performed, and the polydopamine resin can be used in a suitable amount so as not to adversely affect other physical properties.

The electrically conductive material may include poly(3,4-ethylenedioxythiophene):poly(styrene sulfonate) (PEDOT:PSS), polyaniline resins, polydiphenyl resins, acetylene resins, poly(t-butyl)diphenylacetylene resins, poly(trifluoromethyl)diphenylacetylene resins, copperphthalocyanine (Cu—PC) resins, poly(bistrifluoromethyl)acetylene resins, polybis(t-butyldiphenyl)acetylene resins, poly(trimethylsilyl)diphenylacetylene resins, poly(carbazole)diphenylacetylene resins, polydiacetylene resins, polyphenylacetylene resins, polypyridineacetylene resins, polymethoxyphenylacetylene resins, polymethylphenylacetylene resins, poly(t-butyl)phenylacetylene resins, polynitrophenylacetylene resins, poly(trifluoromethyl)phenylacetylene resins, poly(trimethylsilyl)phenylacetylene resins and the like. For example, it may include PEDOT:PSS, polyaniline resins, polynitrophenylacetylene resins, poly(trifluoromethyl)phenylacetylene resins, poly(trimethylsilyl)phenylacetylene resins and the like. However, the kind of electrically conductive material is not specifically limited. The electrically conductive material may be contained in an amount of about 4-35 wt %, for example, about 10-30 wt %, for example, about 15-25 wt %, based on 100 wt % of the total weight of the transparent electrode film composition. In this content range, there are advantages in that the film has excellent electrical conductivity, and the effect of increasing electrical conductivity by use of the electrically conductive material is suitable, indicating that this content range is cost-effective.

The polydopamine resin comprises a polydopamine polymer, and the catechol functional group of the polydopamine polymer can increase the interfacial adhesion and dispersion between the above-described polymer resin and electrically conductive material. The polydopamine polymer may be contained in an amount of about 2-20 mg/a, for example, about 5-10 mg/a, based on 100 wt % of the total weight of the polydopamine resin. In this content range, there are advantages in that the effect of increasing the interfacial adhesion between the electrically conductive material and the polymer resin is excellent and the polydopamine resin has suitable viscosity, and thus the mixing thereof with other components is well maintained. In addition, the polydopamine resin may, if necessary, further comprise a buffer, a solvent and an oxidizing agent. The polydopamine resin may have a pH of about 8-9, for example, about 8.2-8.8. In this pH range, the interfacial adhesion between the polymer resin and the electrically conductive material is excellent, and the effect of dispersing the electrically conductive material is excellent. In addition, a buffer and an acid may be used to more properly adjust the pH. The polydoapmine resin may be contained in an amount of about 1-10 wt %, for example, about 3-8 wt %, for example, about 5-7 wt %, based on 100 wt % of the total weight of the transparent electrode film composition. In this content range, the effect of increasing the interfacial adhesion is excellent, and the polydopamine resin has suitable viscosity, and thus the mixing thereof with other components is well maintained. The buffer that is used in embodiments of the present invention may be one that is generally used in the art. For example, the buffer may include Triz base, sodium phosphate, TBE (tris/borate/EDTA), TBS (tris-buffered saline), PBS (phosphate buffered saline) and the like, but is not specifically limited thereto. The solvent that is used in embodiments of the present invention may be one that is generally used in the art. For example, the solvent may be distilled water or the like. The oxidizing agent is used to increase reaction rate, and as oxidizing power increases, the reaction rate can increase. For example, the oxidizing agent may include sodium periodate, dimethyldioxirane, potassium permanganate, hydrogen peroxide, trifluoroperacetic acid, N-methylmorpholine N-oxide, oxone and the like.

In another embodiment, the conductive transparent electrode layer 153 or 253 may further include, in addition to the transparent electrode film composition, palladium, platinum, aluminum, silver, copper, gold, nickel, tin, indium oxide, cobalt, indium tin oxide (ITO), antimony tin oxide (ATO), fluorine-doped tin oxide (FTO), zinc tin oxide (ZTO), metal nanowires, carbon nanotubes (CNTs), graphene and the like. However, the kind of additional component is not specifically limited. The addition of the above-described components makes it possible to more specifically achieve the physical properties (such as transparency and visibility) of the transparent electrode film layer according to embodiments of the present invention.

As described above, the transparent electrode film layer 150 or 250 can be formed by electrospinning various transparent electrode film compositions. The electrospinning may be performed using a known method, and a method for performing the electrospinning is not specifically limited. For example, the electrospinning may be performed at a temperature of about 20° C. to about 80° C., for example, about 40° C. to about 80° C. The electrospinning may be performed at a voltage of about 5-15 kV, for example, about 10-15 kV. If the electrospinning is performed at a voltage within the foregoing range, the amount of polymer introduced into a jet may not be too small or too large, and thus the electrospinning is properly performed, and the web thickness may be properly controlled during web formation. In addition, the spinning distance may be about 10-20 cm, for example, about 12-18 cm. If the electrospinning is performed at a distance of about 10 cm to about 20 cm, the transparent electrode film composition can be uniformly spun, and it may be easy to collect nanowebs on a collector after spinning. In addition, the electrospinning is preferably performed for 2-4 hours under the above-described conditions.

The transparent electrode film layer 150 or 250 may have a surface resistivity of about 0.01-100 Ω/square, for example, about 10-50 Ω/square, as measured in accordance with ASTM D257. In this surface resistivity range, there are advantages in that the pattern of light that is reflected or shielded can be achieved in various ways and the freedom of design of the product can be increased. In addition, the transparent electrode film layer 150 or 250 may have a transparency of about 80% or more, for example, about 90% or more, as measured in accordance with ASTM D1003. In this transparency range, there are advantages in that the transparent electrode film layer substitutes for a PCB board shown in FIG. 1 to fundamentally eliminate the cause of the hot spot phenomenon and shows excellent luminous efficiency by efficiently performing the function of the surface light source. The transparent electrode film layer 150 or 250 may be a monolayer structure having an average thickness of about 10-200 μm, for example, about 100-150 μm. In this average thickness range, there are advantages in that the thickness of the transparent electrode film layer can be reduced.

The lighting device according to embodiments of the present invention may further comprise second reflective patterns or pieces 245 for shielding or reflecting light, formed on the upper surface of the transparent electrode film layer 150 or 250.

The second reflective patterns 245 may be formed on the upper surface of the transparent electrode film layer 150 or 250 for the purpose of shielding or reflecting light emitted from the plurality of light-emitting units 130 or 230 so as to prevent the light from being concentrated. Embodiments of the present invention has an advantage in that the second reflective patterns 245 can be selectively applied, if necessary.

The second reflective patterns 245 may be composed of light-shielding patterns configured to prevent the concentration of light emitted from the plurality of light-emitting units 135 or 235. For this purpose, the second reflective units can be arranged such that they are at positions corresponding to the plurality of light-emitting units 135 or 235.

The cross-sectional shape of the second reflective patterns 245 may be any one selected from among polygonal shapes such as a triangular shape or a square shape, a circular shape, an oval shape, a convex lens shape, a concave lens shape, and a combination of two or more of these shapes, but is not limited thereto. This shape has the advantage of maximizing the three-dimensional pattern of light.

The second reflective patterns 245 may be formed of light-shielding patterns that have a light-shielding effect so as to prevent optical properties from being deteriorated due to the excessively high intensity of light or prevent yellowish light from being emitted. Such light-shielding patterns can be formed by performing a printing process using a light-shielding ink.

The second reflective patterns 245 may be implemented to adjust the level of shielding or reflection of light by one second reflective pattern so that it can perform the function to partially shield and diffuse light rather than the function to completely shield light. For example, the second reflective patterns 245 may have an overlapping printed complex pattern structure formed by forming one pattern and printing another pattern shape thereon.

The second reflective patterns 245 may be formed by printing a reflective ink containing a white pigment in a binder. For example, the second reflective patterns 245 may be formed by printing the upper surface of the transparent electrode film layer 150 or 250 with a reflective ink containing one or more white pigments, selected from among titanium oxide, aluminum oxide, zinc oxide, lead carbonate, barium sulfate, silica and calcium carbonate, in a binder such as polystyrene resin, but is not limited thereto.

For example, the second reflective patterns 245 may have overlapping light-shielding pattern structures comprising: a light reflective pattern formed by printing the upper surface of the transparent electrode film layer 150 or 250 with a light-shielding ink containing one or more selected from among titanium oxide, calcium carbonate, barium sulfate, silica and calcium carbonate; and a light-shielding pattern formed using aluminum or a mixture of aluminum and titanium oxide. In addition, the second reflective patterns may also be formed to have a two-layer structure either by white-printing a diffusion pattern on the surface of the transparent electrode film layer 150 or 250 and then forming a light-shielding pattern thereon or by forming the light-shielding pattern and the diffusion pattern in an order opposite thereto. The design for forming such patterns may vary depending on the efficiency and intensity of light and the level of light shielding. Furthermore, the second refractive patterns may be formed to have a three-layer structure by forming a light shielding pattern made of a metal as an intermediate layer and forming a diffusion pattern on and under the light shielding pattern. This three-layer structure may be formed using materials selected from among the above-described materials. For example, the efficiency and uniformity of light can be secured through the three-layer structure in which one diffusion pattern is formed of titanium oxide having a high refractive index, another diffusion pattern is formed of titanium oxide in combination with calcium carbonate having excellent light stability and color sensitivity, and the light shielding pattern is formed of aluminum having excellent obliterating power. In particular, calcium carbonate functions to reduce the exposure of yellowish light to thereby emit white light, and thus enables light to be more effectively emitted. In addition to calcium carbonate, inorganic materials having a large particle size and a similar structure, such as barium sulfate, aluminum oxide and silica beads, may also be used. In view of luminous efficiency, the second reflective patterns 245 are preferably formed by adjusting the density of the patterns such that the pattern density decreases as it gets away from the direction of light emission from the light-emitting units 135 or 235.

Light-Emitting Units

In the lighting device shown in FIG. 1, LEDs as light sources are mounted laterally on the PCB board so as to emit light laterally to the reflective element. As a substitute for such LEDs, the light-emitting units 135 or 235 enable the hot spot phenomenon to be essentially prevented, show excellent luminous efficiency by efficiently performing the function of the surface light source, and can be included for the purpose of reducing the kinds of raw materials and the number of production processes.

In embodiments, the light-emitting units 135 or 235 according to the embodiment of the present invention do not include light-emitting diodes (LEDs) mounted laterally, but include LEDs provided by a chip-on-film or chip-on-board method, and thus are formed on the lower surface of the transparent electrode film layer 150 or 250 in a direction opposite to the reflective element layer 110 or 210.

The light-emitting units 135 or 235 are portions in which a plurality of light sources are arranged to emit light. In embodiments of the present invention, a plurality of light-emitting units 135 or 235 are arrayed so that they emit light vertically or at a certain angle, whereby various light-harvesting configurations can be implemented, and thus various geometrical optical design configurations can be implemented.

The plurality of light-emitting units 135 or 235 may be arranged in a line so as to be spaced apart at the same distance from each other, or may be arranged to be spaced apart at different distances from each other. In addition, the plurality of light-emitting units 135 or 235 may be configured such that they emit light in different directions but the emitted lights may also overlap each other.

The plurality of light-emitting units 135 or 235 may be included in a light source array so that they can be simultaneously driven. Alternatively, the light-emitting units may be electrically insulated from each other so that they can be individually driven. The distance between the light-emitting units may be controlled depending on the quantity of light emitted from the light-emitting units 135 or 235. In addition, when the light-emitting units include a single light source array, they are preferably used for a light source having a narrow width.

The lighting device 100 or 200 according to embodiments of the present invention may comprise a circular reflective element layer 110 or 210 as a base substrate, and there is no limitation on the structure of the lighting device 100 or 200. In embodiments of the present invention, the optical resin layer 110 or 210 and the transparent electrode film layer 150 or 250 are made of flexible materials, and thus can be easily applied even to a curved surface. Thus, the lighting device 100 or 200 according to the embodiment of the present invention has an advantage in that the light-emitting units 135 and 235 can be arranged in various configurations without any structural limitation, indicating that the freedom of design can be increased. Though this light-emitting unit arrangement, the first reflective patterns, the second reflective patterns, etc., light harvesting can be achieved in various ways so that a change in the geometrical shape of light can be achieved.

As described above, the lighting device according to embodiments of the present invention comprises the reflective element layer, the optical resin layer formed on the reflective element layer, the transparent electrode film layer formed on the optical resin layer, and the plurality of light-emitting units formed on the lower surface of the transparent electrode film layer. Thus, it can eliminate the fundamental cause of the hot spot phenomenon, and shows excellent luminous efficiency by efficiently performing the function of the surface light source. In addition, according to embodiments of the present invention, the kinds of raw materials and the number of processes can be reduced by eliminating the use of a PCB board and selectively applying second reflective patterns.

Embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A laminated device for surface lighting, the device comprising:
    a reflective resin layer comprising a reflective surface;
    an optical resin layer formed over the reflective resin layer;
    a transparent electrode film layer formed over the optical resin layer and comprising a lower surface opposing the reflective surface; and
    a chip-on-film (COF) structure formed on the lower surface of the transparent electrode film layer, the COF structure comprising an array of a plurality of light-emitting units, each of which comprises a base and an LED, the base comprising a concave surface facing the reflective surface, the LED positioned in a central area of the concave surface of the base,
    wherein the LED of each light emitting unit is configured to emit light beams such that the light beams emitted from the LED are directed to the reflective surface and redirected to outside the surface lighting device via the optical resin layer and the transparent electrode film layer after reflection on the reflective surface, wherein the laminated device does not comprise a PCB formed underneath the reflective resin layer.

2. The device of claim 1, wherein the reflective resin layer comprises a resin matrix and a white pigment dispersed in the resin matrix.

3. The device of claim 2, wherein the resin matrix comprises at least one of polyethylene terephthalate resins, polyethylene naphthalate resins, acrylic resins, polycarbonate resins, polystyrene resins, polyolefin resins, and cellulose acetate resins.

4. The device of claim 2, wherein the white pigment comprises at least one of titanium oxide, aluminum oxide, zinc oxide, lead carbonate, barium sulfate, silica, and calcium carbonate.

5. The device of claim 2, further comprising first reflective patterns formed on an upper surface of the reflective resin layer.

6. The device of claim 5, wherein the first reflective patterns are formed by printing a reflective ink containing a white pigment in a binder.

7. The device of claim 1, wherein the optical resin layer comprise at least one of urethane acrylate resins, epoxy acrylate resins, and polyester acrylate resins.

8. The device of claim 7, wherein the optical resin layer further comprises beads made of at least one of silicon, glass bubbles, zinc, zirconium, aluminum oxide, urethane resins, and (meth)acrylic resins.

9. The device of claim 8, wherein the beads have voids or pores formed therein.

10. The device of claim 1, wherein the transparent electrode film layer comprises an insulating transparent resin layer and a conductive transparent electrode layer formed on an upper surface of the insulating transparent resin layer.

11. The device of claim 10, wherein the insulating transparent resin layer comprises at least one of polycarbonate resins, polyester resins, polyimide resins, cycloolefin resins, and copolymers thereof.

12. The device of claim 10, wherein the conductive transparent electrode layer comprises about 60-95 wt % of polymer resins, about 4-35 wt % of an electrically conductive materials, and about 1-10 wt % of polydopamine resins.

13. The device of claim 10, wherein the conductive transparent electrode layer further comprises at least one of palladium, platinum, aluminum, silver, copper, gold, nickel, tin, indium oxide, cobalt, indium tin oxide (ITO), antimony tin oxide (ATO), fluorine-doped tin oxide (FTO), zinc tin oxide (ZTO), metal nanowires, carbon nanotubes (CNTs), and graphene.

14. The device of claim 1, wherein the transparent electrode film layer has a surface resistivity of about 0.01-100 Ω/square as measured in accordance with ASTM D257, and a transparency of about 80% or more as measured in accordance with ASTM D1003, and an average thickness of about 10-200 μm.

15. The device of claim 1, further comprising second reflective patterns for shielding or reflecting light, formed on an upper surface of the transparent electrode film layer.

* * * * *